(12) United States Patent
Ong (10) Patent No.: US 7,466,603 B2
(45) Date of Patent: Dec. 16, 2008

(54) MEMORY ACCESSING CIRCUIT SYSTEM

(75) Inventor: Adrian E. Ong, San Jose, CA (US)

(73) Assignee: Inapac Technology, Inc., San Jose, CA (US)

( * ) Notice: Subject to any disclaimer, the term of this patent is extended or adjusted under 35 U.S.C. 154(b) by 0 days.

(21) Appl. No.: 11/906,731

(22) Filed: Oct. 2, 2007

(65) Prior Publication Data

US 2008/0089139 A1 Apr. 17, 2008

Related U.S. Application Data

(60) Provisional application No. 60/828,052, filed on Oct. 3, 2006.

(51) Int. Cl.
*G11C 7/00* (2006.01)

(52) U.S. Cl. .................. 365/189.08; 365/49.1; 365/201; 365/230.06

(58) Field of Classification Search ............ 365/189.08, 365/230.06, 201, 49.1
See application file for complete search history.

(56) References Cited

U.S. PATENT DOCUMENTS

| | | | |
|---|---|---|---|
| 4,263,650 A | 4/1981 | Bennett | |
| 4,825,414 A | 4/1989 | Kawata | |
| 4,873,669 A | 10/1989 | Furutani | |
| 5,251,095 A | 10/1993 | Miller | |
| 5,321,819 A * | 6/1994 | Szczepanek | ................ 709/228 |
| 5,326,428 A | 7/1994 | Farnworth | |
| 5,457,400 A | 10/1995 | Ahmad | |
| 5,479,105 A | 12/1995 | Kim | |
| 5,523,697 A | 6/1996 | Farnworth | |
| 5,528,539 A | 6/1996 | Ong | |
| 5,535,165 A | 7/1996 | Davis | |
| 5,594,694 A | 1/1997 | Roohparvar | |
| 5,619,461 A | 4/1997 | Roohparvar | |
| 5,657,284 A | 8/1997 | Beffa | |
| 5,677,884 A | 10/1997 | Zagar | |
| 5,677,885 A | 10/1997 | Roohparvar | |
| 5,719,438 A | 2/1998 | Beilstein | |
| 5,751,015 A | 5/1998 | Corbett | |
| 5,751,987 A | 5/1998 | Mahant-Shetti | |
| 5,761,145 A | 6/1998 | Zagar | |
| 5,801,452 A | 9/1998 | Farnworth | |
| 5,805,609 A | 9/1998 | Mote, Jr. | |
| 5,807,762 A | 9/1998 | Akram | |

(Continued)

OTHER PUBLICATIONS

U.S. Appl. No. 11/207,518, Adrian Ong, Architecture and Method for Testing of an Intergrated Circuit Device, filed on Aug. 19, 2005.

(Continued)

*Primary Examiner*—Pho M. Luu
(74) *Attorney, Agent, or Firm*—Carr & Ferrell LLP (57) ABSTRACT

A configurable memory system and method is wherein an integrated circuit coupled to a memory device includes application logic and memory interface logic in communication with the application logic, the memory interface logic configured to access a memory array within the memory device. The memory interface logic provides logic functions and/or signals that would have been provided by logic on a prior art memory device. The interface logic may access the memory device synchronously or asynchronously. The integrated circuit may communicate to the memory device using multiplexed or non-multiplexed signals.

25 Claims, 9 Drawing Sheets

U.S. PATENT DOCUMENTS

| | | |
|---|---|---|
| 5,825,697 A | 10/1998 | Gilliam |
| 5,825,782 A | 10/1998 | Roohparvar |
| 5,838,620 A | 11/1998 | Zagar |
| 5,912,579 A | 6/1999 | Zagar |
| 5,923,600 A | 7/1999 | Momohara |
| 5,925,142 A | 7/1999 | Raad |
| 5,936,260 A | 8/1999 | Corbett |
| 5,959,310 A | 9/1999 | Akram |
| 5,966,388 A | 10/1999 | Wright |
| 5,970,008 A | 10/1999 | Zagar |
| 6,011,720 A | 1/2000 | Tanaka |
| 6,026,039 A | 2/2000 | Kim |
| 6,069,483 A | 5/2000 | Maxwell |
| 6,072,326 A | 6/2000 | Akram |
| 6,087,676 A | 7/2000 | Akram |
| 6,097,647 A | 8/2000 | Zagar |
| 6,100,716 A | 8/2000 | Adham |
| 6,104,645 A | 8/2000 | Ong |
| 6,104,658 A | 8/2000 | Lu |
| 6,137,167 A | 10/2000 | Ahn |
| 6,154,860 A | 11/2000 | Wright |
| 6,157,046 A | 12/2000 | Corbett |
| 6,188,232 B1 | 2/2001 | Akram |
| 6,191,603 B1 | 2/2001 | Muradali |
| 6,194,738 B1 | 2/2001 | Debenham |
| 6,205,082 B1 | 3/2001 | Tomita |
| 6,208,157 B1 | 3/2001 | Akram |
| 6,208,568 B1 | 3/2001 | Zagar |
| 6,216,240 B1 | 4/2001 | Won |
| 6,216,241 B1 | 4/2001 | Fenstermaker |
| 6,226,723 B1 | 5/2001 | Gustavson |
| 6,243,839 B1 | 6/2001 | Roohparvar |
| 6,243,840 B1 | 6/2001 | Raad |
| 6,274,937 B1 | 8/2001 | Ahn |
| 6,286,115 B1 | 9/2001 | Stubbs |
| 6,294,839 B1 | 9/2001 | Mess |
| 6,298,001 B1 | 10/2001 | Lee |
| 6,300,782 B1 | 10/2001 | Hembree |
| 6,310,484 B1 | 10/2001 | Akram |
| 6,320,201 B1 | 11/2001 | Corbett |
| 6,351,681 B1 | 2/2002 | Chih |
| RE37,611 E | 3/2002 | Roohparvar |
| 6,365,421 B2 | 4/2002 | Debenham |
| 6,366,487 B1 | 4/2002 | Yeom |
| 6,392,948 B1 | 5/2002 | Lee |
| 6,395,565 B1 | 5/2002 | Akram |
| 6,396,291 B1 | 5/2002 | Akram |
| 6,407,566 B1 | 6/2002 | Brunelle |
| 6,441,479 B1 | 8/2002 | Ahn |
| 6,445,625 B1 | 9/2002 | Abedifard |
| 6,457,141 B1 | 9/2002 | Kim |
| 6,483,760 B2 | 11/2002 | Kang |
| 6,484,279 B2 | 11/2002 | Akram |
| 6,492,727 B2 | 12/2002 | Nishizawa |
| 6,502,215 B2 | 12/2002 | Raad |
| 6,507,885 B2 | 1/2003 | Lakhani |
| 6,519,171 B2 | 2/2003 | Matsuzaki |
| 6,519,725 B1 | 2/2003 | Huisman |
| 6,531,339 B2 | 3/2003 | King |
| 6,671,836 B1 * | 12/2003 | Lai et al. .................... 714/718 |
| 6,675,269 B2 | 1/2004 | Miura |
| 6,711,042 B2 | 3/2004 | Ishikawa |
| 6,732,304 B1 | 5/2004 | Ong |
| 6,756,803 B2 | 6/2004 | Miura |
| 6,812,726 B1 | 11/2004 | Ong |
| 6,825,683 B1 | 11/2004 | Berndt |
| 6,882,171 B2 | 4/2005 | Ong |
| 6,928,017 B2 | 8/2005 | Yahata |
| 6,967,348 B2 | 11/2005 | Cowles |
| 6,967,397 B2 | 11/2005 | Inoue |
| 6,996,745 B1 | 2/2006 | Shaylor |
| 7,006,940 B1 | 2/2006 | Ong |
| 7,053,470 B1 | 5/2006 | Sellers |
| 7,061,263 B1 | 6/2006 | Ong |
| 7,075,175 B2 | 7/2006 | Kazi |
| 7,133,798 B1 | 11/2006 | Ong |
| 7,139,204 B1 | 11/2006 | Behera |
| 7,139,945 B2 | 11/2006 | Ong |
| 7,149,135 B2 | 12/2006 | Okuno |
| 7,218,569 B2 | 5/2007 | Richter |
| 7,240,254 B2 | 7/2007 | Ong |
| 7,245,141 B2 | 7/2007 | Ong |
| 7,254,582 B2 | 8/2007 | Song |
| 7,259,582 B2 | 8/2007 | Ong |
| 7,265,570 B2 | 9/2007 | Ong |
| 7,269,524 B1 | 9/2007 | Ong |
| 7,269,765 B1 | 9/2007 | Charlton |
| 7,305,595 B2 | 12/2007 | Goodwin |
| 7,307,442 B2 | 12/2007 | Ong |
| 7,309,999 B2 | 12/2007 | Ong |
| 7,310,000 B2 | 12/2007 | Ong |
| 7,313,740 B2 | 12/2007 | Ong |
| 7,365,557 B1 | 4/2008 | Ong |
| 7,370,256 B2 | 5/2008 | Ong |
| 7,395,472 B2 | 7/2008 | Nilson |
| 7,402,897 B2 | 7/2008 | Leedy |
| 7,404,117 B2 | 7/2008 | Ong |
| 2002/0105522 A1 | 8/2002 | Kolluru |
| 2004/0019841 A1 | 1/2004 | Ong |
| 2005/0289428 A1 | 12/2005 | Ong |

OTHER PUBLICATIONS

U.S. Appl. No. 11/208,099, Adrian Ong, A Processor Memory Unit for Use in System-in-Package and System-in-Module Device, filed Aug. 18, 2005.

U.S. Appl. No. 11/370,795, Adrian Ong, Integrated Circuit Testing Module Including Address Generator, filed Mar. 7, 2006.

U.S. Appl. No. 11/472,016, Adrian Ong, Shared memory bus architecture for system with processor and memory units, filed Jun. 20, 2006.

U.S. Appl. No. 11/538,799, Adrian Ong, Testing and Recovery in a Multilayer Device, filed Oct. 4, 2006.

U.S. Appl. No. 11/552,938, Adrian Ong, Integrated Circuit Testing Module Including Signal Shaping Interface, filed Oct. 25, 2006.

U.S. Appl. No. 11/552,944, Adrian Ong, Integrated Circuit Testing Module Configured for Set-up and Hold Time Testing, filed Oct. 25, 2006.

U.S. Appl. No. 11/744,815, Adrian Ong, Integrated Circuit Testing Module Including Multiplexed Inputs, May, 4, 2007.

U.S. Appl. No. 11/853,006, Adrian Ong, Delay Lock Loop Delay Adjusting Method and Apparatus, Sep. 10, 2007.

U.S. Appl. No. 11/981,854, Electronic Device Having An Interface Supported Testing Mode, filed Oct. 31, 2007.

Jedec Solid State Technology Association, "Jedec Standard, Double Data Rate (DDR) SDRAM Specification," May 2005, pp. 1-85, Revision of JESD79D, Jedec Solid State Technology Association, Arlington, Virginia, USA.

Jedec Solid State Technology Association, "Jedec Standard, DDR2 SDRAM Specification," May 2006, pp. 1-110, JESD79-2C, Jedec Solid State Technology Association, Arlington, Virginia, USA.

* cited by examiner

FIG. 10

MEMORY ACCESSING CIRCUIT SYSTEM

CROSS-REFERENCE TO RELATED APPLICATIONS

This application claims benefit of U.S. Provisional Patent Application Ser. No. 60/828,052 filed on Oct. 3, 2006, titled "Configurable Memory Architecture" which is incorporated by reference herein.

This application is related to U.S. patent application Ser. No. 11/223,286, filed on Sep. 9, 2005, titled "Shared Bond Pad for Testing a Memory within a Packaged Semiconductor Device," now U.S. Pat. No. 7,245,141. This application is also related to U.S. patent application Ser. No. 11/304,445, titled "Integrated Circuit Testing Module" filed on Dec. 14, 2005, now U.S. Pat. No. 7,265,570, to co-pending U.S. patent application Ser. No. 11/258,484, titled "Component Testing and Recovery" filed on Oct. 24, 2005, and to U.S. patent application Ser. No. 11/480,234, titled "Delay Lock Loop Delay Adjusting Method and Apparatus," filed on Jun. 30, 2006, now U.S. Pat. No. 7,269,524. The disclosures of all of the above U.S. patents and patent applications are incorporated by reference herein.

BACKGROUND

Manufacturers of memory and integrated circuits have established a number of standardized communication protocols for memory devices to communicate with the integrated circuits over a multiplexed bus. Many memory devices include logic circuits that conform to these standardized communication protocols. These logic circuits may be configured to provide logic functions for decoding signals from the integrated circuit and provide memory access. The integrated circuit typically communicates with the memory device over a bus. The bus width (e.g., the number of separate signal channels) may be limited by the physical size and layout of the memory device and/or integrated circuit.

Figure 1:
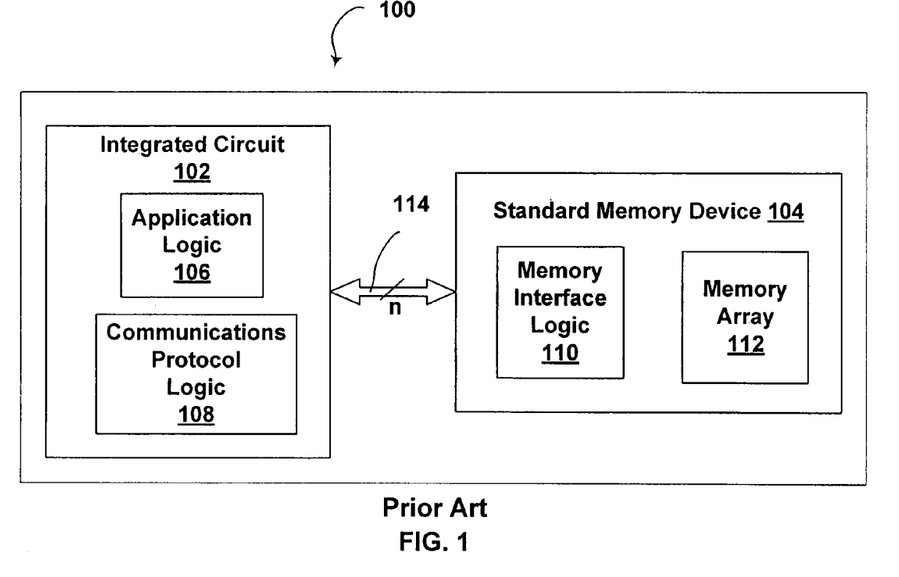
FIG. 1 is a block diagram illustrating an integrated circuit in communication with a memory device, according to the prior art.

FIG. 1 is a block diagram illustrating a typical prior art circuit system 100. The prior art circuit system 100 includes an integrated circuit 102, a memory device 104, and a bus 114 of width "n" configured to communicate signals, using the "n" conductors, between the integrated circuit 102 and the memory device 104.

The integrated circuit 102 includes an application logic 106, configured for the integrated circuit 102 to operate as a microprocessor, an application specific integrated circuit (ASIC), a peripheral interface, or the like. The integrated circuit 102 further includes a communications protocol logic 108 configured to provide communication between the integrated circuit 102 and the memory device 104 according to a standard communications protocol.

In various embodiments, the memory device 104 includes static random access memory (SRAM), dynamic random access memory (DRAM), synchronous DRAM (SDRAM), non-volatile random access memory (NVRAM), read only memory (ROM), programmable ROM (PROM), erasable programmable ROM (EPROM), electrically erasable PROM (EEPROM), double data rate synchronous DRAM (DDRAM), embedded DRAM (EDRAM), flash memory, disk drives, or the like. In some embodiments, memory device 104 includes a memory interface logic 110 and a memory array 112. In some embodiments, the memory array 112 comprises an array of memory elements such as memory cells. The memory interface logic 110 is configured to receive signals from the communications protocol logic 108 according to the standard communications protocol and provide memory access to the memory array 112. Memory access includes writing data to the memory, reading data from the memory, performing error detection and/or correction, resetting the memory, testing the memory, and the like.

SUMMARY

Various embodiments of the invention include an integrated circuit in which logic functions for communicating with a separate memory that would have been performed on a memory device instead are performed on the integrated circuit. The integrated circuit comprises application logic and memory interface logic for receiving memory request signals from the application logic and performing the logic functions for communicating with the separate memory. The logic functions include generating memory access signals (e.g., row address, column address, RAS, CAS, and the like). In some embodiments the integrated circuit further includes an optional communications protocol logic configured receive memory communications signals from the application logic according to standard communications protocols and generate the memory access signals.

Various embodiments include a system comprising a memory device, and a separate integrated circuit mounted to the memory device, the integrated circuit comprising application logic configured to generate memory request signals including a memory address, and memory interface logic configured to receive the memory request signals, generate one or more pre-decoded address signals representative of the memory address, and access the memory device using the one or more pre-decoded address signals, and a plurality of connections configured to communicate the one or more pre-decoded address signals between the integrated circuit and the memory device.

Various embodiments include a system comprising a memory device, and a separate integrated circuit mounted to the memory device, the integrated circuit comprising application logic configured to generate memory communications signals including a memory address, communications protocol logic configured to receive memory communications signals in a predetermined format from the application logic and generate memory request signals including the memory address, and memory interface logic configured to receive the memory request signals, generate one or more pre-decoded address signals representative of a memory address, and access the memory device using the one or more pre-decoded address signals, and a plurality of connections configured to communicate the one or more pre-decoded address signals between the integrated circuit and the memory device.

Various embodiments of the invention include a method comprising receiving one or more memory communications signals in a predetermined protocol, decoding the predetermined protocol of the memory communications signals using communications protocol logic to generate memory request signals, generating one or more decoded memory address signals according to the memory request signals, using memory interface logic disposed on the integrated circuit, and accessing a memory device using the one or more decoded memory address signals.

Various embodiments of the invention include an integrated circuit comprising an application logic configured to generate a memory access request including a memory address, and a memory interface logic configured to receive the memory address from the application logic, decode the memory address to generate one or more decoded memory address signals representative of the memory address, access a memory device using the one or more decoded memory address signals, and communicate the one or more decoded memory address signals to a memory device using a bus configured to connect the memory device to the integrated circuit.

Various embodiments of the invention include a memory device comprising at least one bank of memory comprising an array of memory cells, a plurality of non-multiplexed connectors configured to receive a plurality of non-multiplexed, pre-decoded row address signals and a plurality of non-multiplexed, pre-decoded column address signals from an external integrated circuit configured to receive memory request signals from an application logic and generate the pre-decoded row address signals and pre-decoded column address signals, and an asynchronous device interface logic configured to receive the plurality of pre-decoded row address signals, and the plurality of pre-decoded column address signals from the plurality of non-multiplexed connectors and select a memory cell from the array of memory cells.

DETAILED DESCRIPTION

Various embodiments of the invention include a circuit system in which logic functions that would be performed on a memory device in the prior art, are instead performed on an integrated circuit separate from a memory device. The logic functions include, for example, decoding memory request signals (e.g., memory address, read, write, reset, and the like) and generating memory access signals (e.g., row address, column address, RAS, CAS, bank select, timing, control, and the like). The integrated circuit includes both application logic and a memory interface logic configured to receive the memory request signals from the application logic and generate memory access signals. Typically, the application logic and memory interface logic are fabricated on the same wafer. The memory interface logic is further configured to perform logic functions including using the memory access signals for accessing the separate memory device over a bus, and receiving results of the memory access from the separate memory device. In some embodiments, the integrated circuit further includes optional communications protocol logic for receiving formatted memory communications signals compatible with a memory device (e.g., multiplexed signals) and generating the memory request signals.

Figure 2:
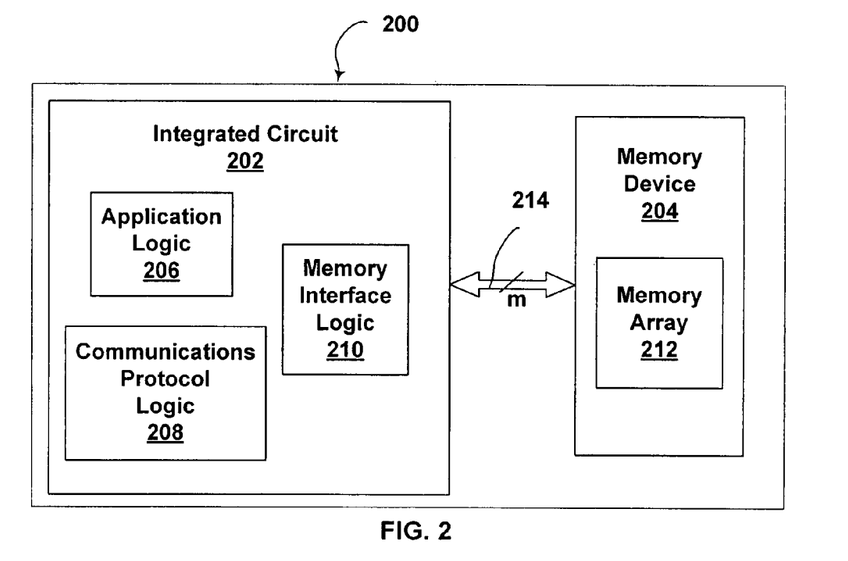
FIG. 2 is a block diagram illustrating various embodiments of a circuit system.

FIG. 2 is a block diagram illustrating various embodiments of a circuit system. The circuit system 200 includes an integrated circuit 202, a memory device 204, and a bus 214. The integrated circuit 202 includes an application logic 206, an optional communications protocol logic 208, and a memory interface logic 210. The memory device 204 includes a memory array 212 comprising one or more arrays of rows and columns of memory cells. In some embodiments, the memory device 204 is separated from the integrated circuit 202 (e.g., the memory device 204 is on a separate silicon wafer than the integrated circuit 202). Alternately, the memory device 204 may be coupled to the integrated circuit 202 using the bus 214. The bus 214 includes a plurality of conductors (i.e., "m") configured to carry separate signals (e.g., at least 4, 8, 16, 32, 64, 128, 256, 512, 1024, 2048, 4096, 8192 or any number of separate signals). The number "m" is not limited to powers of 2 and may include any number of address bits, control signals, clock signals, data bits, etc.

In various embodiments, the application logic 206 is configured to function as an ASIC adapted for use as a microprocessor, an I/O interface circuit, a disk controller, a signal processor, a servo controller, or a fast Fourier transform logic. In some examples, the application logic 206 may be adapted to use within a temperature controller, a video processor, a video game, a cell phone, a personal digital assistant (PDA), a proportional integral derivative (PID) controller, a digital camera, or the like. The application logic 206 may generate memory request signals for various memory access functions (e.g., write data to memory, read data from memory, reset memory, test memory, or the like). The memory request signals include address signals, data signals, read signals, write signals, access type signals, reset signals, error detection signals, error correction signals, and/or the like.

The memory interface logic 210 is configured to perform logic functions on the integrated circuit 202 for providing communications between the memory device 204 and the application logic 206. In various embodiments, the memory interface logic 210 performs some or all of the logic functions that would have been performed by logic on a memory device (e.g., the memory interface logic 110 on the memory device 104). The memory interface logic 210 is configured to receive the memory request signals from the application logic 206. The memory interface logic 210 may receive the memory request signals using software, hardware, firmware, or a combination thereof. For example, the memory interface logic 210 may include latches to receive the memory request signals. Alternatively, memory interface logic 210 may use software to receive the memory request signals as data.

The memory interface logic 210 may be further configured to decode the memory request signals and generate one or more memory access signals for accessing the memory array 212 within the memory device 204. As used herein, pre-decoded signals may refer to signals that have been partially decoded or fully decoded, and/or de-multiplexed. Various examples of signals include multiplexed signals, binary encoded signals, binary coded decimal (BCD) signals, and the like.

For example, a row address may comprise thirteen bits that are embedded in a twenty-four bit memory address. A pre-decoded row address may include thirteen row address bits extracted from the twenty-four bit memory address. In another example, a memory address may include twenty-four address bits, multiplexed as six words that are four bits wide. The six words may be de-multiplexed and combined into a single pre-decoded memory address word that is twenty-four bits wide. In some embodiments, a pre-decoded binary weighted address may include one or more binary weighted address signals along with one or more decoded address signals (e.g., strobe signals, select signals, or the like) that have been decoded from the binary weighted address. In another example, a pre-decoded BCD address may include decoded address signals that have been fully decoded from the BCD address.

In some embodiments, pre-decoded signals include address signals, partially decoded address signals, or fully decoded address signals, that have been de-multiplexed from multiplexed address signals. Memory access signals include data, pre-decoded row address signals, RAS, pre-decoded column address signals, CAS, pre-decoded bank select signals, timing and control signals, clock signals, delayed clock signals, error detection, error correction, and/or the like. In one example, the memory interface logic 210 includes a RAS chain configured to generate the RAS for strobing a selected a row in the memory array 212 into an array of sense amplifiers. In another example, the memory interface logic 210 may include logic for generating a bank select signal row address signals, column address signals, a CAS signal, a delayed clock signal, and the like. In various embodiments, the memory interface logic 210 includes a CAS chain and/or a bank select chain. The memory interface logic 210 may be configured to communicate with the memory device 204 synchronously or asynchronously.

In some embodiments, the integrated circuit 202 is mounted to the memory device 204. The bus 214 may include nano or micro-scale interconnections (e.g., less than 100 microns in width). In some examples, these micro-scale connections are less than 50, 25, 10, 5, and 1 micron in width. The integrated circuit 202, the bus 214, and the memory device 204 may be packaged using a multi-chip module (MCM), a system in package (SiP), a micro-scale system on package (SOP), a nano-scale SOP, or the like.

In some embodiments, the memory interface logic 210 is configured to receive the memory request signals from the application logic 206 via the communications protocol logic 208. The communications protocol logic 208 may receive memory communications signals from the application logic 206 and generate the memory request signals from the memory communications signals. The memory communications signals may be received in a format according to a standardized protocol (e.g., multiplexed) established within the integrated circuit industry for communications with memory devices (e.g., the memory device 104). The communications protocol logic 208 may be useful in adapting application logic (e.g., the application logic 106) that would have been configured to communicate with memory devices (e.g., the memory device 104, DRAM, SDRAM, DDRAM, NVRAM, ROM, PROM, EPROM, EEPROM, DDRAM, EDRAM, flash memory, disk drives, and the like) for use with the memory interface logic 210 in the integrated circuit 202. In one example, the communications protocol logic 208 reformats the memory request signals (i.e., the memory communications signals) received from the application logic 206 before providing the reformatted memory request signals to the memory interface logic 210.

The communications protocol logic 208 may generate the memory request signals using software, hardware, firmware, or a combination thereof. For example, the communications protocol logic 208 may include software configured to de-multiplex the memory communications signals that are multiplexed, and latches configured to output the memory request signals to the memory interface logic 210. Alternatively, the communications protocol logic 208 outputs the memory request signals to the memory interface logic 210, using software or firmware to generate the memory request signals.

Figure 3:
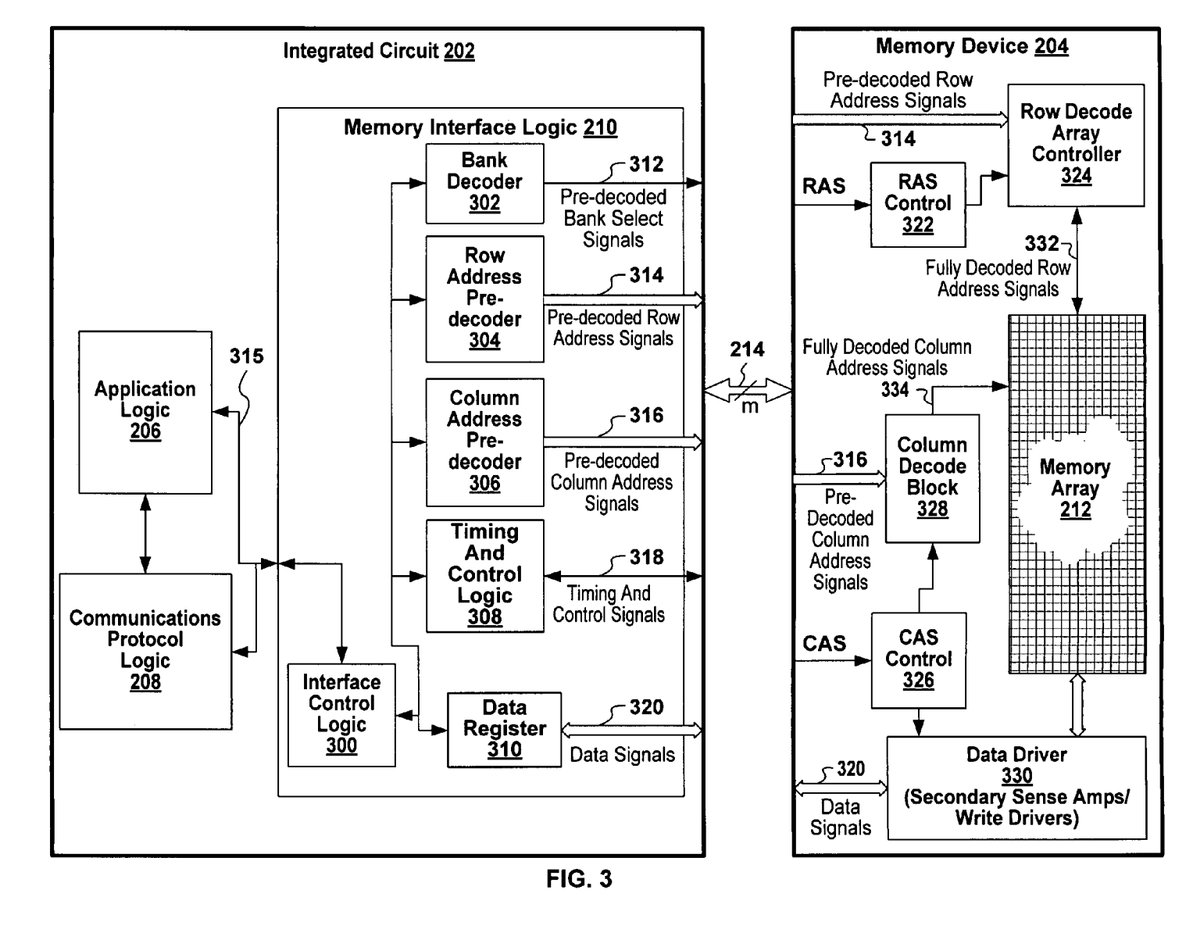
FIG. 3 is a block diagram illustrating details of an exemplary embodiment of the memory interface logic and the memory device of the circuit system of FIG. 2.

FIG. 3 is a block diagram illustrating details of an exemplary embodiment of the memory interface logic 210 and the memory device 204 of the circuit system 200 of FIG. 2. The memory interface logic 210 is configured to receive memory request signals 315 and generate memory access signals. In some embodiments, the memory access signals may comprise one or more of the following: a pre-decoded bank select signals 312, a pre-decoded row address signals 314, a pre-decoded column address signals 316, and a timing and control signals 318. Various components of the memory interface logic 210 may include software, hardware, firmware, or combinations thereof. The memory interface logic 210 includes interface control logic 300, an optional bank decoder 302, an optional row address pre-decoder 304, and an optional column address pre-decoder 306, timing and control logic 308, and a data register 310.

The interface control logic 300 is configured to receive the memory request signals 315 from the application logic 206 (or optionally, the communications protocol logic 208). The memory request signals 315 may include various combinations of address signals, data signals, read signals, write signals, clock signals, control signals, command signals, access type signals, master/slave signals, block size signals, address valid signals, interrupt signals, request signals, device ID signals, access time signals, device type descriptor signals, device select signals, error detection signals, error corrections signals, reset signals, and/or the like. The interface control logic 300 is further configured to output memory data signals that have been returned from the memory device 204 (e.g., data, status, error state, and the like) to the application logic 206 (optionally via the communications protocol logic 208).

The bank decoder 302 is configured to receive a bank signal from the interface control logic 300 and output one or more pre-decoded bank select signals 312 to the memory device 204. For example, the bank decoder 302 may receive a bank signal in the form of two predetermined bits of a plurality of address bits from the interface control logic 300 and decode the two predetermined bits to assert one of four pre-decoded bank select signals 312, using a two line to four line decoder/demultiplexer device. In various embodiments, the bank decoder 302 may decode/demultiplex any number of bits (e.g., three bits, four bits, or five bits). Optionally, the bank decoder 302 is configured to receive five signals (e.g., a chip select signal, the RAS, the CAS, a write enable signal and a clock enable signal) for decoding into thirty-two memory array control signals, and to send the thirty-two memory array control signals over the bus 214 for controlling the memory device 204 and directly selecting banks of memory array 212.

The row address pre-decoder 304 is configured to receive a row address from the interface control logic 300 and output one or more pre-decoded row address signals 314 to the memory device 204. For example, the row address pre-decoder 304 receives a thirteen bit row address embedded in a twenty-four bit memory address from the interface control logic 300. The row address pre-decoder 304 may extract pre-decoded row address signals 314 comprising a single word thirteen bits wide. In some embodiments, the memory address is multiplexed as multiple words (e.g., four bits wide, six bits wide, etc.) and the row address pre-decoder 304 may decode/demultiplex the row address.

The thirteen bit row address may be further pre-decoded to select one of 8192 rows. For example, row address bits 0 and 1 (RA01) may be pre-decoded as 1-of-4 sub word-line driver signals (i.e., final stage row select drivers). Row address bits 2 and 3 (RA23) may likewise be pre-decoded as 1-of-4 sub word-line driver signals. Row address bits 4, 5, and 6 (RA456) may be pre-decoded as 1-of-8 global word-line driver signals in a sub array section. Row address bits 7, 8, and 9 (RA789) may likewise be pre-decoded as 1-of-8 global word-line driver signals. Thus, row address bits 0-9 (e.g., RA01, RA23, RA456, and RA789) may use 24 signals to encode 1024 physical word-lines of a sub array section. Row address bits 10, 11, and 12 may be pre-decoded as 1-of 8 sub array select signals. Thus, the thirteen bit row address (i.e., row address bits 0-12) may be pre-decoded into thirty-two pre-decoded address signals and communicated to the memory device 204 for use in selecting a row of the memory array 212 addressed by the row address.

In some embodiments, the row address pre-decoder 304 partially decodes a thirteen bit row address and outputs two hundred and fifty-six decoded row address signals along with five of the row address bits for a total of two hundred and sixty-one pre-decoded row address signals 314 to the memory device 204. One or more of the two hundred and fifty-six decoded row address bits may be asserted. The row address pre-decoder may receive twelve address bits and output four thousand ninety-six decoded row address bits as the pre-decoded row address signals 314, asserting one or more of the bits according to the row address. The row address pre-decoder 304 may be configured to perform some or all of the functions that would have been performed by memory interface logic on a memory device (e.g., the memory interface logic 110 in the memory device 104 in FIG. 1). Optionally, the row address pre-decoder 304 may be omitted and the interface control logic 300 may be configured to output one or more row address signals to the memory device 204. For example, RA01 decode 1-of-4 sub-wordline drivers (i.e., the final stage row select drivers). RA34-RA789 may be used to decode the global wordline drivers in the sub-array section. In this case, there are a total of 1024 physical wordlines in a sub-array section. RA_AB and RA_C are use to decode 1-of-8 sub-arrays. Note that one can pre-decode bit 10, 11, and 12 to RA_ABC, but it is convenient to separate RA_C for 4096-row option (Example, 4-k row x32-bit option vs. 8-k row x16 option).

The column address pre-decoder 306 may be configured to receive a column address from the interface control logic 300 and output one or more pre-decoded column address signals 316 to the memory device 204. In one example, the column address pre-decoder 306 receives a nine bit column address embedded in a twenty-four bit memory address from the interface control logic 300 and extract pre-decoded column address signals 316 comprising a single word nine bits wide. In some embodiments, the memory address is multiplexed as multiple words (e.g., four bits wide, six bits wide, etc.) and the column address pre-decoder 306 may decode/demultiplex the column address.

In some embodiments, the nine bit column address is further pre-decoded to select one of 256 columns. For example, column address bit 0 (CA0) is pre-decoded as 1-of-2, odd/even signals (e.g., selecting odd or even data) for double data rate operation, column address bits 1 and 2 (CA12) are pre-decoded as 1-of-4 column select signals. Additionally, column address bits 3 and 4 (CA34), column address bits 5 and 6 (CA56), and column address bits 7 and 8 (CA78), are likewise pre-decoded. Thus, column address bits 1-8 (e.g., CA12, CA34, CA56, and CA78) may address 256 physical columns. The nine bit column address (i.e., column address bits 0-8) may be pre-decoded into eighteen signals and communicated to the memory device 204 for use in selecting a column of the memory array 212 addressed by the column address and even or odd data within the column.

In some embodiments, column address pre-decoder 306 fully decodes a column address (e.g., seven bits) and outputs pre-decoded column address signals 316 (e.g., one hundred and twenty-eight) to the memory device 204. One or more of the one hundred and twenty-eight pre-decoded column address bits may be asserted. The column address pre-decoder 306 may be configured to perform some or all of the functions that would have been performed by memory interface logic on a memory device (e.g., the memory interface logic 110 in the memory device 104 in FIG. 1). Optionally, the column address pre-decoder 306 may be omitted and the interface control logic 300 may output one or more column address signals to the memory device 204.

The memory interface logic 210 further includes timing and control logic 308. The timing and control logic 308 may be configured to communicate timing and control signals 318 between the interface control logic 300 and the memory device 204. The timing and control signals 318 may include clock signals, access type signals, read signals, write signals, device select signals, error detection signals, error corrections signals, reset signals, RAS, CAS, and the like. In some embodiments, the timing and control logic 308 is configured to perform some or all of the functions of the RAS and/or the CAS chain that would have been performed by memory interface logic on a memory device (e.g., the memory interface logic 110 in the memory device 104 in FIG. 1). The timing and control logic 308 may include a delay lock loop (DLL) for adjusting the phase of one or more clock signals.

The memory interface logic 210 further includes a data register 310. The data register 310 is configured to communicate data signals 320 between the interface control logic 300 and the memory device 204. For example, the data register 310 communicates data signals 320 to be written from the interface control logic 300 to the memory device 204. In various embodiments, the data register 310 communicates data signals 320 received from the memory device 204 (e.g., data returned by a read request, error data, status data, and the like) to the interface control logic 300. In some embodiments, the data register 310 includes one or more sense amplifiers configured to receive data signals 320 from the memory device 204 in the form of charge packets and amplify the charge packets, changing the signal level to a level compatible with various types of digital devices (e.g., TTL, CMOS, ECL, Joint Electron Device Engineering Council (JEDEC) standard serial stub termination logic (SSTL)-2, JEDEC standard SSTL-18, or the like) The data register 310 may include one or more latches for communicating data signals 320 between the interface control logic 300 and the one or more sense amplifiers on the memory device 204.

In some embodiments, signals associated with a data read (e.g., read, row address, column address, RAS, CAS, timing and control, and the like) are communicated over a set of conductors of the bus 214 that are different from signals associated with a data write (e.g., write, row address, column address, RAS, CAS, timing and control, and the like). For example, two hundred and fifty-six signals are carried by two hundred and fifty-six conductors of the bus 214 for a data read operation, and two hundred and fifty-six different signals are carried by two hundred and fifty-six different conductors of the bus 214 for a data write operation, using a total of five hundred and twelve conductors. Additional conductors in the bus 214 may be used for operations such as error detection, error correction, reset, set, memory testing, and the like.

Various embodiments of the memory device 204 include one or more banks of memory array 212. Each of the one or more banks of the memory array 212 may be selected for a memory access by one or more pre-decoded bank select signals 312. Each of the one or more banks of memory array 212 may be configured as a two dimensional array of rows and columns of memory cells. Although only one bank of memory array 212 is illustrated in FIG. 3, the memory array 212 may comprise any number of banks.

Various embodiments of the memory device 204 further include device interface logic which may comprise an optional RAS control 322, an optional row decode array controller 324, an optional CAS control 326, an optional column decode block 328, and an optional data driver 330. The RAS control 322 may be configured to receive the RAS from the memory interface logic 210 and communicate the RAS to the row decode array controller 324.

The row decode array controller 324 may be configured to receive the pre-decoded row address signals 314 from the memory interface logic 210 and the RAS from the RAS control 322, and output fully decoded row address signals 332. In some embodiments, the pre-decoded row address signals 314 include partially decoded address signals (e.g., a combination of pre-decoded and non-pre-decoded address signals). Alternatively, the pre-decoded row address signals 314 may include fully decoded row address signals 332 and the row decode array controller 324 may function as a buffer or a latch.

In various embodiments, the row decode array controller 324 communicates the RAS to the memory array. 212 or use the RAS to strobe the address signals from the row decode array controller 324 to the memory array 212. Alternatively, the row decode array controller 324 may be omitted, for example, when the pre-decoded row address signals 314 have been fully decoded and latched by the row address pre-decoder 304 in the memory interface logic 210. The decoded memory address signals may select a row of memory cells in the selected bank of the memory array 212. Upon receiving the decoded row address signals and the RAS, the memory array 212 may output data in the selected row. The memory array 212 may be configured to output the contents of the entire selected row of memory cells, a block of memory cells within the row, or a single memory cell in the row.

In some embodiments, data in the row of memory cells selected by the decoded memory address signals is received by an array of one or more sense amplifiers. The array of secondary sense amplifiers may be included in the memory device 204 (e.g., the memory array 212 or the data driver 330), or the integrated circuit 202 (e.g., the data register 310). Two or more stages of sense amplifiers may be used to amplify the charge packets. In various embodiments, the two or more stages of sense amplifier arrays are included in the memory array 212, the memory device 204, and/or the integrated circuit 202. The two or more stages may be distributed between the memory device 204 and the integrated circuit 202.

The data driver 330 may be configured to communicate data signals 320 between the memory device 204 and the integrated circuit 202. In various embodiments, the data driver 330 includes secondary sense amplifiers, and/or write drivers. The data driver 330 may receive data from the memory array 212 and the integrated circuit 202 (e.g., the data register 310), as well as output data signals 320 to the memory array 212 and the integrated circuit 202. The received data may be the contents of a row of memory cells selected by the fully decoded row address signals 332 or a block of memory cells selected by the fully decoded row address signals 332 and the fully decoded column address signals 334. Examples of various block sizes include 1, 8, 64, 256, 512, 1024, 2048, 4096, 8192, or any number of memory cells. Block sizes are not limited to powers of two.

The data driver 330 may further receive one or more timing and control signals 318 from the timing and control logic 308, and/or the column decode block 328 (e.g., read data, write data, CAS, fully decoded column address signals 334, and the like). Optionally, the data driver 330 receives the CAS from the CAS control 326. In various embodiments, the data driver 330 includes one or more arrays of secondary sense amplifiers and/or write drivers. In some embodiments the data driver 330 includes one or more arrays of latches configured to buffer data signals 320 between the memory array 212 and the memory interface logic 210.

The column decode block 328 is configured to receive the pre-decoded column address signals 316 from the memory interface logic 210 and the CAS from the CAS control 326, and output fully decoded column address signals 334 to the memory array 212. The pre-decoded column address signals 316 may include partially decoded address signals (e.g., a combination of pre-decoded and non-pre-decoded address signals). Alternatively, the pre-decoded column address signals 316 include the fully decoded column address signals 334, and the column decode block 328 function as a buffer or a latch. Optionally, the column decode block 328 is omitted, for example when the pre-decoded column address signals 316 have been fully decoded and latched by the column address pre-decoder 306 in the memory interface logic 210. The CAS may be received from the CAS control 326 by the memory array 212, the column decode block 328, and/or the data driver 330. In various embodiments, the fully decoded column address signals 334 are output from the column decode block 328 to the memory array 212 or the data driver 330. The column decode block 328 may communicate the CAS to the memory array 212 or use the CAS to strobe the output of the column address signals from the column decode block 328 to the memory array 212.

Upon receiving the decoded column address signals and the CAS, the memory array 212 may output data in the selected row. In various embodiments, the fully decoded column address signals 334, strobed by the CAS, select a block of memory cells in the memory array 212 for output as a block of data to the data driver 330 or in the data driver 330 for output to the integrated circuit (e.g., data register 310). A block of data may include a single bit. Optionally, the memory array 212 outputs the contents of a column or a block of memory cells selected by the fully decoded column address signals 334 to the integrated circuit 202 (e.g., the data register 310). Examples of various block sizes include 1, 8, 64, 256, 512, 1024, 2048, 4096, 8192, or more memory cells. Block sizes are not limited to powers of two.

Alternatively, the type of access may be a write to the memory array 212. A write may include writing data signals 320 from the integrated circuit 202 (e.g., the data register 310) to the data driver 330, and outputting the contents of the data driver 330 to a row of the memory array 212 selected by the fully decoded row address signals 332. In some embodiments, a write includes outputting the contents of a row of memory cells from the memory array 212 to the data driver 330, writing data signals 320 from the integrated circuit 202 (e.g., data register 310) to the data driver 330, and refreshing the row of memory array 212 with the contents of the data driver 330.

For example, upon selection of a row of 4096 memory cells by the fully decoded row address signals 332, fully decoded column address signals 334 may select a block of 256 memory cells within the selected row for output to an array of 256 sense amplifiers in the data driver 330. The block of data may be latched for transfer as data signals 320 to the integrated circuit 202 (e.g., the data register 310) for a read operation. Alternatively, for a write operation the block of data may be modified by transferring data signals 320 from the data register 310 to the data driver 330 and the modified contents of the data driver 330 may be applied to the selected row of the memory array 212.

In one exemplary embodiment, the memory interface logic 210 receives memory request signals 315 from the application logic 206 and outputs memory access signals to the memory device 204. The application logic 206 outputs the memory request signals 315 to the memory interface logic 210 (e.g., the interface control logic 300) as a clock signal, a four bit access type, and an eighteen bit address. The access type indicates that a read operation is to be performed and provide information about the read (e.g., delay, number of words to be read, and the like). The eighteen bit address provides the location of the data in the memory device 204. The bank decoder 302 receives two of the high order bits (bits 16-17, for example) from the interface control logic 300 and outputs four pre-decoded bank select signals 312, asserting one of the four pre-decoded bank select signals 312 according to the two bits.

The timing and control logic 308 receives the four bits of access type from the interface control logic 300 and selects a delay for the clock signal. The timing and control logic 308 outputs timing and control signals 318 including a read signal and a delayed RAS and CAS, over the bus 214 to the memory device 204. The RAS control 322 receives the RAS for communication to the row decode array controller 324 and the CAS control 326 receives the CAS for communication to the column decode block 328 and the data driver 330.

The row address pre-decoder 304 receives twelve of the high order bits (bits 4-15, for example) as a row address and pre-decodes the row address. The row address pre-decoder 304 outputs pre-decoded row address signals 314 according to the row address, over the bus 214. The row decode array controller 324 receives the pre-decoded row address signals 314, over the bus 214, and asserts fully decoded row address signals 332, according to the pre-decoded row address signals 314, upon receiving the RAS from the RAS control 322. The memory array 212 receives the fully decoded row address signals 332. The fully decoded row address signals 332 enable a row of memory cells for output to the data driver 330.

The column address pre-decoder 306 may receive four of the address bits (bits 0-3, for example) and output sixteen pre-decoded column address signals 316, asserting one of the sixteen pre-decoded column address signals 316 according to the four low order bits, over the bus 214. The column decode block 328 may receive the sixteen pre-decoded column address signals 316, over the bus 214, and select a 256 bit block of data from the row of data in the memory array 212.

The read signal may enable the CAS to strobe the selected 256 bit block of data from memory array 212 to the data driver 330. The data driver 330 may receive the CAS from the CAS control 326 and output the 256 bit block of data signals 320 over the bus 214 to the data register 310. The interface control logic 300 may transfer the contents of the data register 310 to the application logic 206. The timing and control signals 318 may refresh the 256 bit block of data in the memory array 212 by writing the contents of the data driver 330 into to the memory array 212.

In one exemplary embodiment, the timing and control signals 318 include a write signal, instead of the read signal. The write signal enables a block of write data (e.g., a 256 bit block) in the data register 310 to be clocked as data signals 320, over the bus 214, into the write drivers in the data driver 330. The data driver 330 writes the contents of the write drivers, including the 256 bit block of write data, into the row of memory cells enabled by the fully decoded row address signals 332 in the memory array 212 upon receiving the CAS from the CAS control 326.

Figure 4:
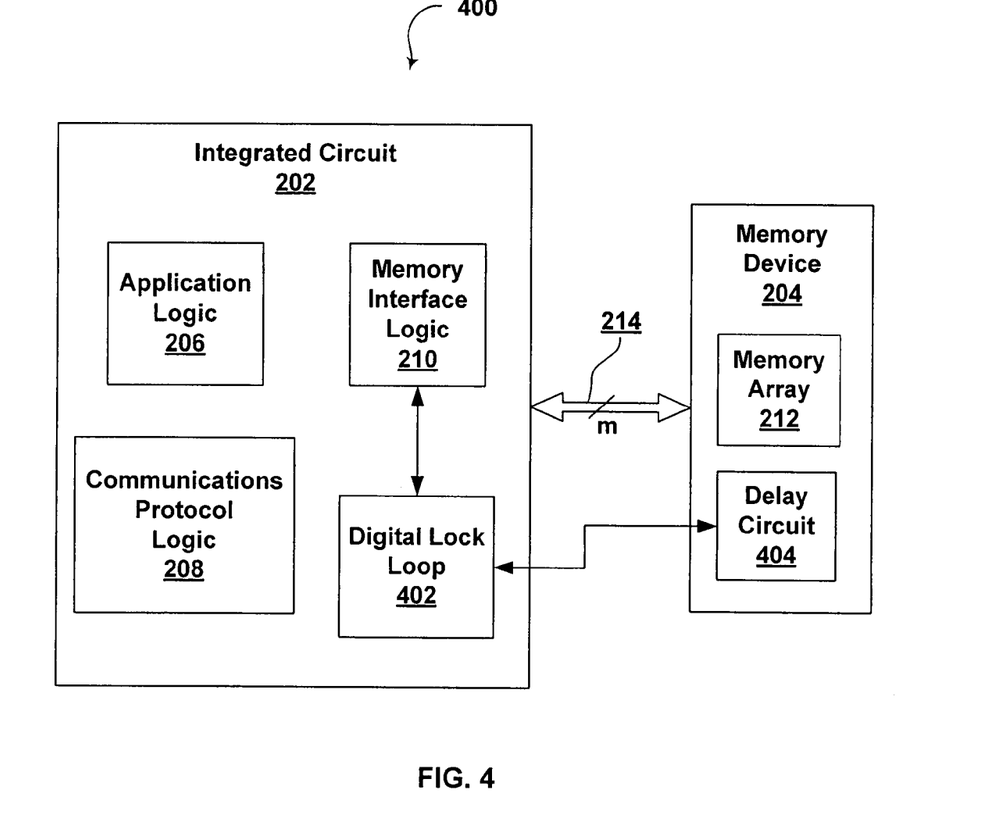
FIG. 4 is a block diagram illustrating alternative embodiments of a circuit system.

FIG. 4 is a block diagram illustrating alternative embodiments of a circuit system 400. The circuit system 400 differs from the circuit system 200 in that the integrated circuit 202 includes a digital lock loop (DLL) 402, in addition to the application logic 206, the communications protocol logic 208, and the memory interface logic 210. Moreover, an alternative embodiment of the memory device 204 includes a delay circuit 404 in addition to the memory array 212. The DLL 402 may include a test circuit configured to measure an elapsed time between sending a test signal to the delay circuit 404 and receive a response signal from the delay circuit 404. In various embodiments, the test signal is transmitted over a dedicated clock trace or spare conductor on the bus 214 to and from the memory device 204 and the integrated circuit 202. The measured elapsed time is used as a representation of physical and/or environmental characteristics of the memory device 204. The measured elapsed time may be used to facilitate the operation of the DLL 402, for example, to improve setup and hold time margins. Further details may be found within U.S. patent application Ser. No. 11/480,234, titled "Delay Lock Loop Delay Adjusting Method and Apparatus," now U.S. Pat. No. 7,269,524, referenced elsewhere herein.

For example, a delay value is determined according to the measured elapsed time. This delay value is used by the DLL 402 as an initial delay time in determining a preferred delay time for communication between the integrated circuit 202 and the memory device 204. The initial delay time may be a first approximation of a preferred delay time and may be incremented (or decremented) using the DLL 402 until the preferred delay time is determined. The use of an initial delay time determined using the measured elapsed time typically reduces the time required to determine the preferred delay time.

Figure 5:
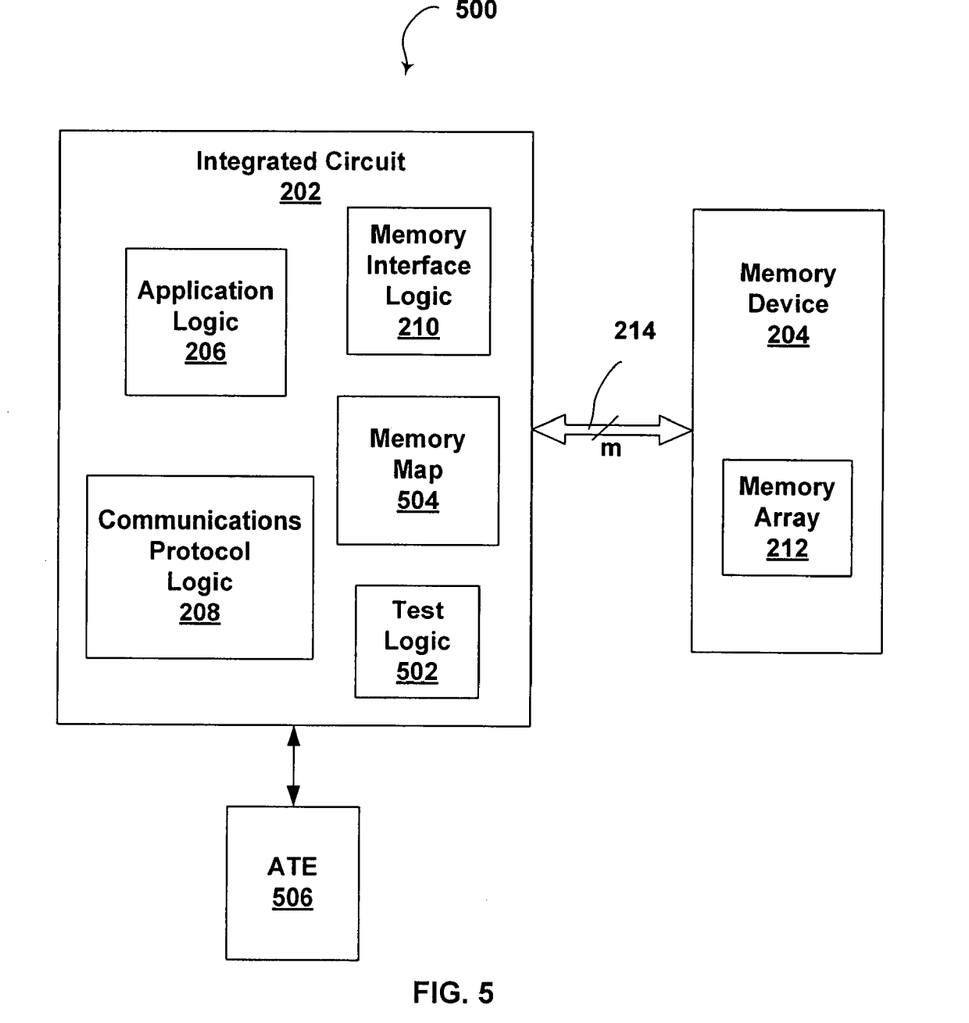
FIG. 5 is a block diagram illustrating alternative embodiments of a circuit system.

FIG. 5 is a block diagram illustrating alternative embodiments of a circuit system 500. The circuit system 500 differs from the circuit system 200 in that the integrated circuit 202 includes test logic 502 and an optional memory map 504, in addition to the application logic 206, the communications protocol logic 208, and the memory interface logic 210. Further, the integrated circuit 202 may be in communication with an optional automated test equipment (ATE) 506. The test logic 502 may be configured to use the memory interface logic 210, and optionally, the memory map 504 for determining a map of one or more defective memory cells in the memory device 204. These electronic devices may be embodied in an electronic device package and may include, for example, system-in-package (SiP), system-on-chip (SoC), system-in-module (SiM) systems, or package-in-package (PoP) systems.

In various embodiments, the test logic 502 may receive control and/or instructions from the ATE 506 and/or the application logic 206. In some embodiments, the memory interface logic 210 may be configured to operate in a normal mode in which the memory interface logic 210 is used for communication between the application logic 206 and the memory device 204, or in a test mode in which the memory interface logic 210 is used for communication between the memory device 204 and the test logic 502, in which the test logic 502 is used for testing the memory component. The memory interface logic may be switched between the normal mode and the test mode using the test logic 502.

Manufacturing yield may be increased by identifying defects within individual device components and, through various approaches, compensating for the identified defects. For example, the map of the one or more defective memory cells may be stored in the memory map 504. The stored information regarding the location of defective memory cells is optionally used to substitute redundant (e.g., excess) memory cells for those memory cells including defects. For example, the locations of cells including defects are identified in a memory component (e.g., the memory array 212 in the memory device 204) and these locations are stored using the memory map 504. Further details may be found within U.S. patent application Ser. No. 11/258,484, titled "Component Testing and Recovery" referenced elsewhere herein.

In another example, the map of the one or more defective memory cells may be determined according to one or more tests performed on the memory device 204 using the test logic 502. The memory map 504 may store a list of the one or more defective memory cell addresses and a corresponding list of one or more valid memory cell addresses for substitution. When the application logic 206 requests a memory access to a defective memory cell in the memory device 204, the memory interface logic 210 uses the memory map 504 to substitute an address for a valid memory cell in the memory device 204, corresponding to the address of the defective memory cell.

In some embodiments, the memory map 504 stores a table of valid memory cell addresses, as determined by one or more tests performed on the memory device 204, using the test logic 502. The test logic 502 may also map a memory address space used by the application logic 206 to the table of valid memory cell addresses in the memory map 504. Each memory address used by the application logic 206 may correspond to a valid memory address in the memory map 504. The memory interface logic 210 may use the table in the memory map 504 to access the valid memory cell addresses in the memory device 204 corresponding to memory addresses requested by the application logic 206.

Figure 6:
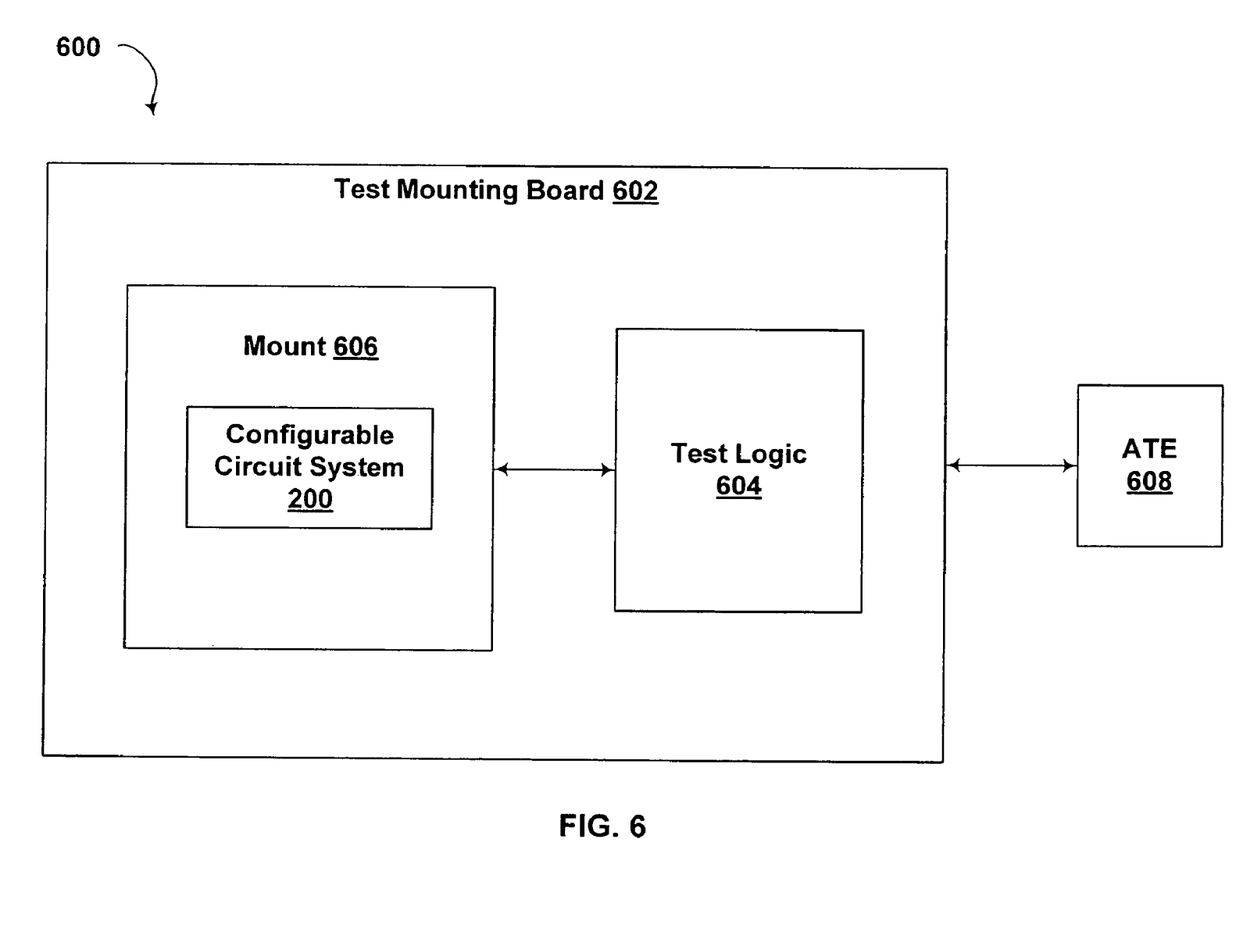
FIG. 6 is a block diagram illustrating a test system including the circuit system of FIG. 2.

FIG. 6 is a block diagram illustrating a test system 600 including the circuit system 200 of FIG. 2. Various embodiments of the test system 600 include a test mounting board 602 and ATE 608. The test mounting board 602 includes test logic 604 configured to operate between a mount 606 and the ATE 608. The mount 606 may be configured to connect to the circuit system 200 to be tested and to communicate signals between the test logic 604 and the circuit system 200. The test logic 604 may be configured to receive data, addresses, and instructions from the ATE 608 and to use these data and instructions to generate additional data and addresses. The test logic 604 may be further configured to use the generated data and addresses to test the circuit system 200, receive test results from the circuit system 200, and to report these test results to the ATE 608. The mount 606 may be configured to communicate data, addresses, and test results between the test logic 604 and the circuit system 200.

Communication between the ATE 608 and the test logic 604 may be at a different clock frequency than communication between the test logic 604 and the circuit system 200 being tested. Through the use of the test logic 604, the ATE 608 may be configured to operate at a first frequency and can be used to test the circuit system 200 at a second higher frequency. For example, an ATE 608 configured to test a circuit system 200 at 150 MHz may be used for testing the circuit system 200 at 300 MHz or more using the test mounting board 602.

In order to test the circuit system 200 at a frequency greater than communications received from the ATE 608, the test logic 604 may include physical components, memory addresses, and test data responsive to an address and test data received from the ATE 608. In some embodiments, these components are programmable to generate a variety of test patterns. The physical components may include circuits and/or multiplexed pins configured to automatically generate communication between the test logic 604 and the memory interface logic 210 (not depicted in FIG. 6) of the circuit system 200. In various embodiments, the physical components may be integrated with the circuit system 200. In some embodiments, the physical components may be integrated with the mount 606. In various embodiments, test system 600 may be configured to test the circuit system 400, and/or 500. Further details may be found within U.S. patent application Ser. No. 11/223,286, filed on Sep. 9, 2005, titled "Shared Bond Pad for Testing a Memory within a Packaged Semiconductor Device," now U.S. Pat. No. 7,245,141, referenced elsewhere herein.

Figure 7:
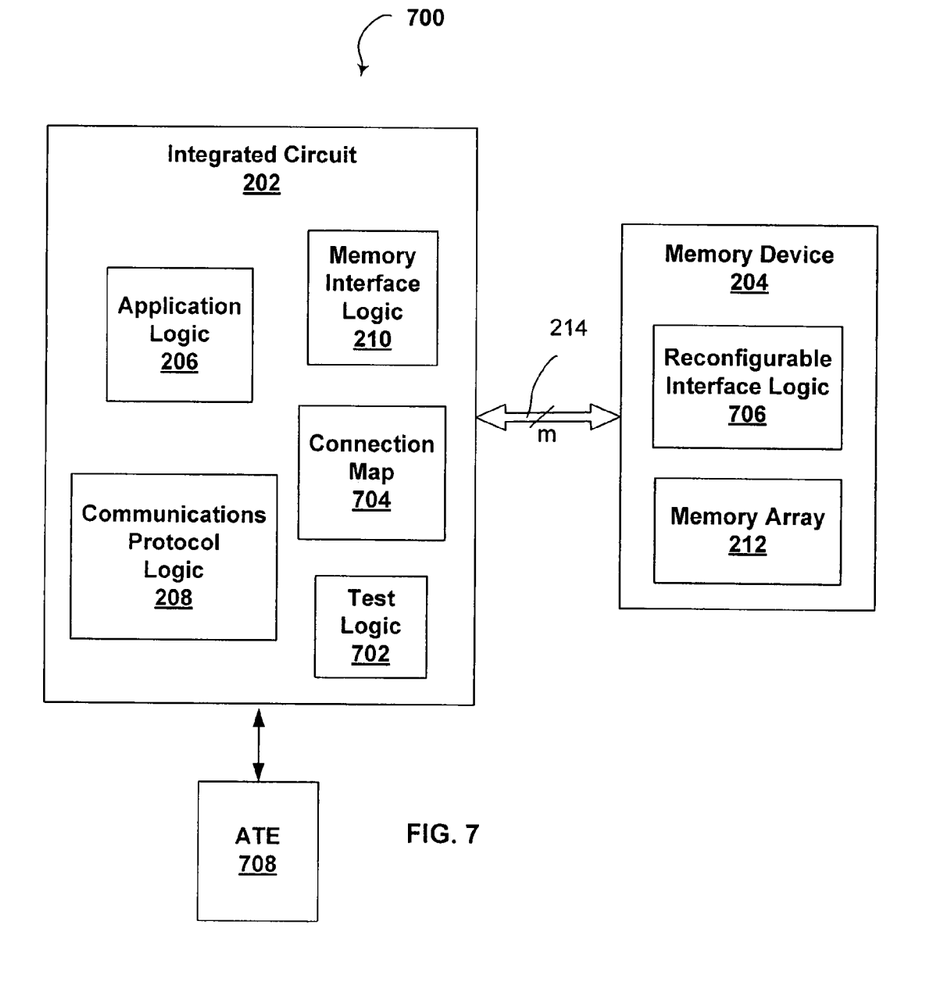
FIG. 7 is a block diagram illustrating alternative embodiments of a circuit system.

FIG. 7 is a block diagram illustrating alternative embodiments of a circuit system 700. The circuit system 700 differs from the circuit system 200 in that the integrated circuit 202 comprising test logic 702 and an optional connection map 704. The integrated circuit 202 may also be in communication with an optional ATE 708. The test logic 702 may be configured to test connections between the integrated circuit 202 and the memory device 204 through the bus 214. The connection map 704 may be configured to store information regarding the status of individual connections. For example, the bus 214 may include 5625 nano-scale connections as a 75 by 75 array. After the memory device 204 is attached to the integrated circuit 202, these connections may be tested using the test logic 702 and the results of these tests stored in the connection map 704. Alternatively, the results of these tests may be communicated to an external test device. The results of tests that are made using the test logic 702 may be optionally used to reconfigure a reconfigurable interface logic 706 within the memory device 204 such that redundant (e.g., excess) connections within bus 214 can be used as substitutes for connections that are defective. In various embodiments, the test logic 702 may receive testing instructions from the ATE 740 and/or the application logic 206. Further details may be found within U.S. patent application Ser. No. 11/258,484, titled "Component Testing and Recovery" referenced elsewhere herein.

Figure 8:
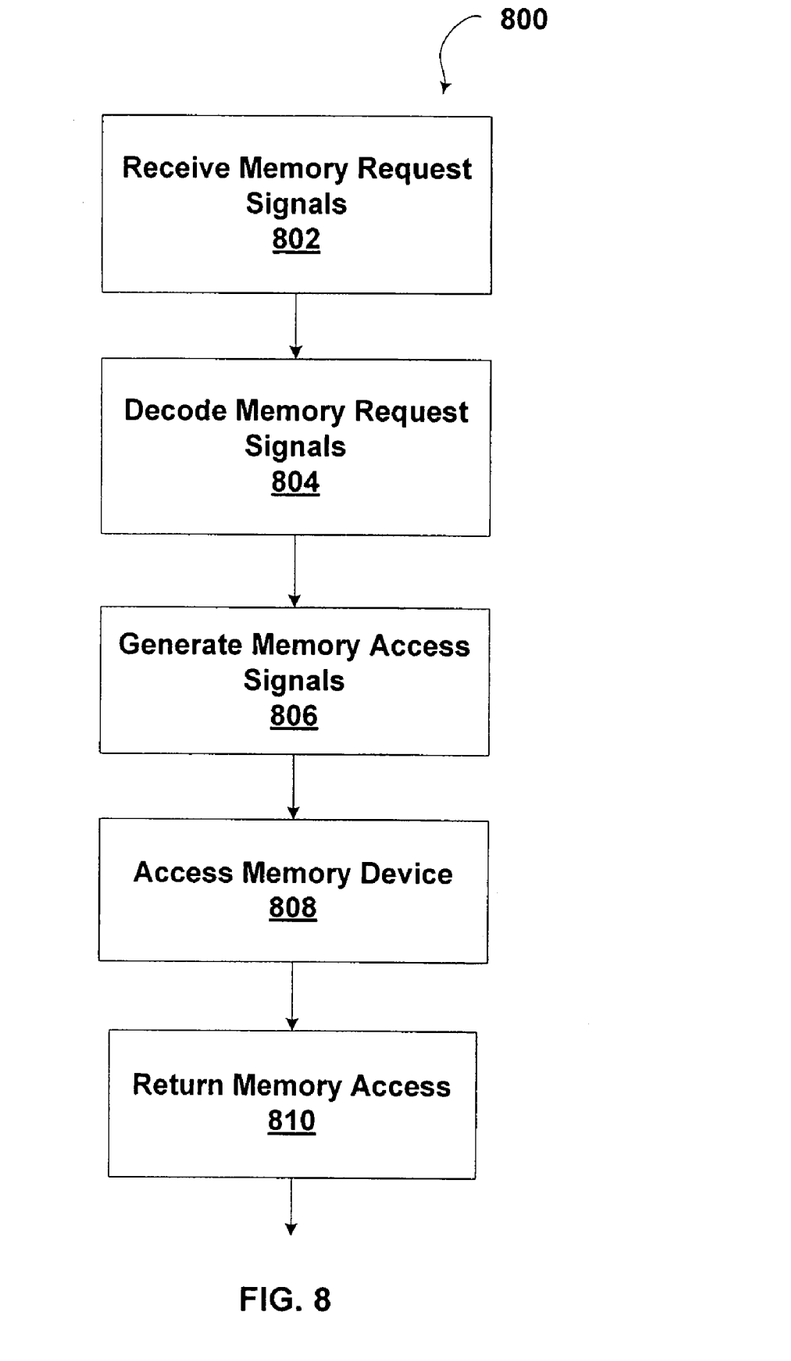
FIG. 8 is a flow diagram illustrating a memory accessing method, according to various embodiments.

FIG. 8 is a flow diagram illustrating a memory access method 800, according to various embodiments. The method 800 includes receiving memory communications signals from application logic (e.g., the application logic 206). Optionally the memory request signals may be compatible with a protocol of prior art memory device (e.g., the memory device 104). In one example, the method 800 may further include decoding the protocol and generating memory request signals for accessing a core memory (e.g., the memory array 212). The memory request signals may be used to generate memory access signals. The memory access signals may provide memory control functions that would have been provided by signals output by memory interface logic on a prior art memory device. The method 800 may further include accessing a memory device (e.g., the memory device 204) using the memory access signals.

Step 802 includes receiving communications protocol signals from an application, for example, the application logic 206. The communications protocol signals may be received, for example, by the communications protocol logic 208.

Step 804 includes decoding the communications protocol signals and generating memory request signals (e.g., the memory request signals 315) using communications protocol logic. The memory request signals 315 may be communicated from the communications protocol logic 208 to the memory interface logic 210. Optionally, the memory interface logic 210 may receive memory request signals 315 directly from the application logic 206.

Step 806 includes generating one or more memory access signals according to the memory request signals using memory interface logic on the integrated circuit. The memory access signals may be compatible with a core memory (e.g., the memory array 212 or the memory device 204).

Step 808 includes accessing a memory device, such as the memory device 204, using the memory access signals generated in the step 806. In some embodiments, the integrated circuit 202 may not receive data from the memory device 204 in response to the memory access step 808. For example, the memory access signals received by the memory device 204 in step 802 may result from a write type of memory access request, a reset type of memory access request, or the like that do not involve data returned from the memory device 204.

Figure 9:
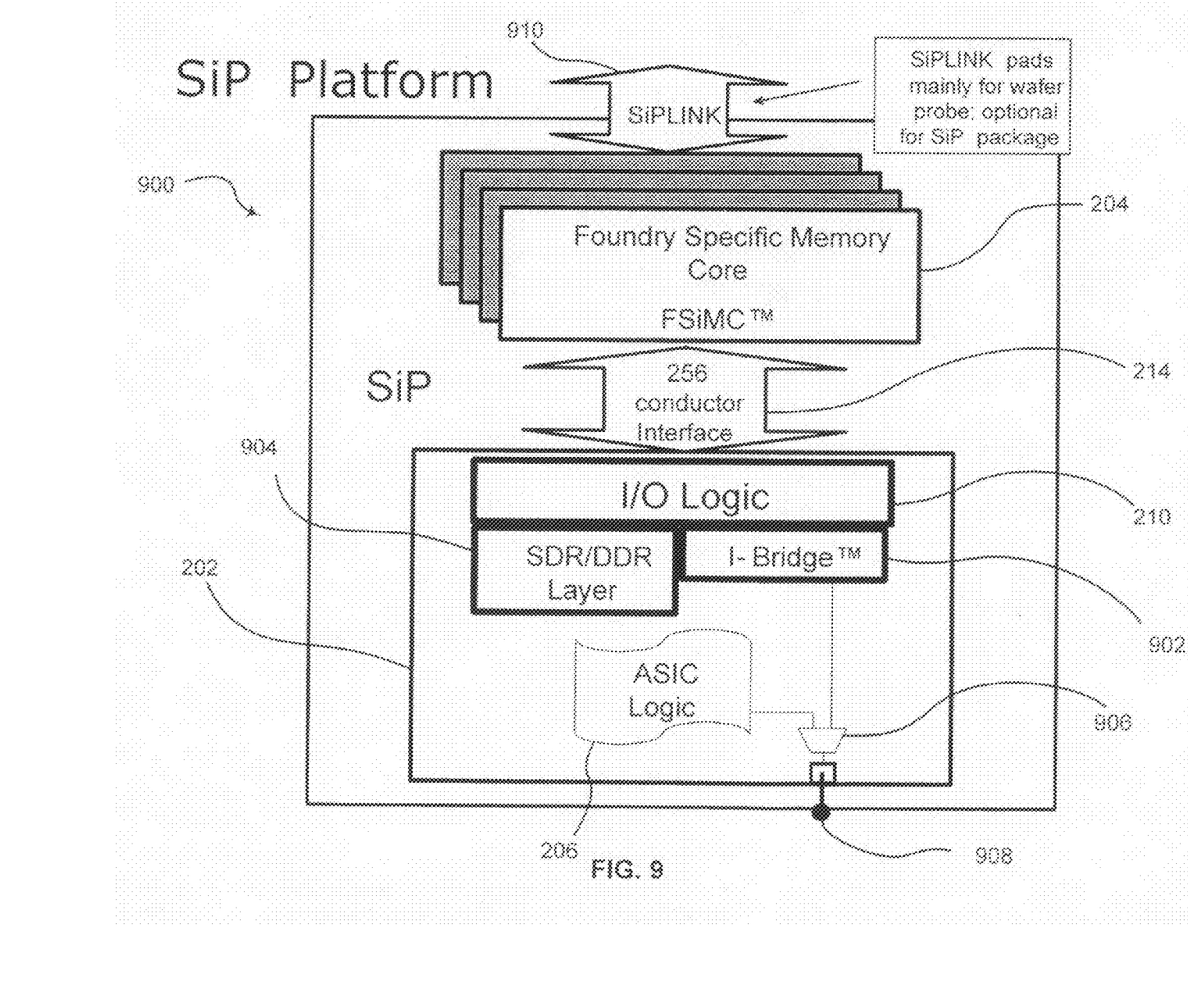
FIG. 9 is a block diagram illustrating alternative embodiments of a circuit system.

FIG. 9 is a block diagram illustrating alternative embodiments of a circuit system 900. The circuit system 900 differs from the circuit system 200 in that the integrated circuit 202 comprising alternative test logic 902 (I-Bridge), and an optional switching link 906. For the purpose of this example, the application logic 206 is illustrated as ASIC logic. The bus 214 is illustrated with 256 conductors (m=256). The memory device 204 is illustrated as including four "Foundry Specific Memory Core" devices and an optional SiPLINK 910. In other embodiments, there may be any number "Foundry Specific Memory Core" devices.

The circuit system 900 further includes a SDR/DDR layer 904, a plurality of pads 908 configured to interface the switching link 906 to an external ATE (not illustrated). The switching link 906 is configured to switch the integrated circuit 202 between a normal mode, in which the application logic 206 accesses the memory, and a test mode in which the test logic 902 determines defective memory cells in the memory device 204.

The test logic 902 may be configured to test the memory device 204 at a frequency greater than communications are received from an ATE. In some embodiments, the test logic 902 includes physical components, memory addresses, and test data that are responsive to address and test data received from the ATE. The test logic 902 may be further configured to generate a variety of test patterns and communication between the test logic 902 and the memory interface logic 210 for testing the memory device 204. Optionally, an ATE may access the memory device 204 using the SiPLINK 910 instead of, or in addition to, the pads 908. Further details of I-Bridge can be found within U.S. patent application Ser. No. 11/304,445, titled "Integrated Circuit Testing Module" filed on Dec. 14, 2005 and U.S. patent application Ser. No. 11/258,484, titled "Component Testing and Recovery" filed Oct. 24, 2005, referenced elsewhere herein.

Figure 10:
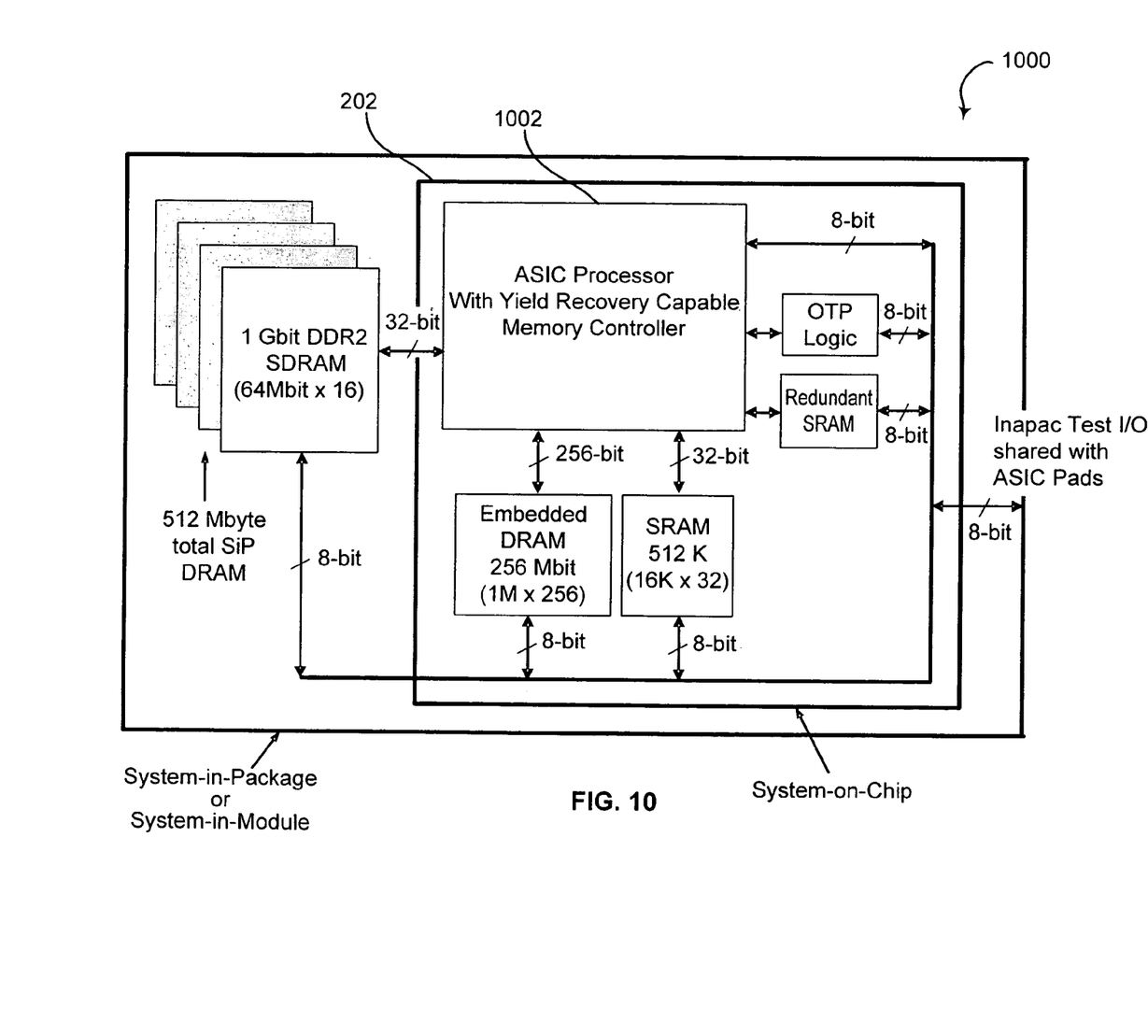
FIG. 10 is a block diagram illustrating an alternative circuit system, according to various embodiments.

FIG. 10 is a block diagram illustrating an alternative circuit system 1000. The circuit system 1000 differs from the circuit system 200 in that the integrated circuit 202 comprising ASIC Processor including test logic 1002 configured to determine defective memory cells and substitute redundant memory cells for the defective memory cells. Further details may be found within U.S. patent application Ser. No. 11/223,286, filed on Sep. 9, 2005, titled "Shared Bond Pad for Testing a Memory within a Packaged Semiconductor Device," now U.S. Pat. No. 7,245,141, referenced elsewhere herein.

Several embodiments are specifically illustrated and/or described herein. However, it will be appreciated that modifications and variations are covered by the above teachings and within the scope of the appended claims without departing from the spirit and intended scope thereof. For example, the functions and features of several devices described herein may be combined into a single device. For example, the application logic 206 and memory interface logic 210 may be combined, the application logic 206 being configured to perform the functions of the memory interface logic 210. For example, the application logic 206 may include ASIC logic designed to communicate with external memory devices, and the communications protocol logic 208 may be configured to emulate the memory devices. The examples provided herein are exemplary and are not meant to be exclusive. For example, method steps described herein may be performed in alternative orders.

The embodiments discussed herein are illustrative of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
   a memory device;
   a separate integrated circuit mounted to the memory device, the integrated circuit comprising
      application logic configured to generate memory request signals including a memory address, and
      memory interface logic configured to receive the memory request signals,
         generate one or more pre-decoded address signals representative of the memory address, and
         access a memory array within the memory device using the one or more pre-decoded address signals; and
   a plurality of connections configured to communicate the one or more pre-decoded address signals between the integrated circuit and the memory device.

2. The system of claim 1, wherein the memory interface logic is further configured to return a result of the memory device access to the application logic.

3. The system of claim 1, wherein the one or more pre-decoded address signals are communicated to the memory device asynchronously.

4. The system of claim 1, wherein the pre-decoded address signals are communicated within the memory device via a plurality of non-multiplexed conductors.

5. The system of claim 1, wherein each of the plurality of connections are less than 50 microns in width.

6. The system of claim 1, further comprising a computing device configured to store data on the memory device, using the separate integrated circuit.

7. The system of claim 1, wherein the integrated circuit further comprises a test circuit configured to measure an elapsed time between sending; a signal to a delay circuit and receiving a response from the delay circuit and use the elapsed time for determining an initial delay for a digital lock loop in the memory interface logic to synchronize the one or more pre-decoded memory address signals.

8. The system of claim 1, wherein the integrated circuit further comprises a test circuit configured to test the memory device for defective memory cells and to store results of the test in a memory map and the memory interface logic is further configured to substitute an address of a valid memory cell for the defective memory cell.

9. A system comprising:
a memory device;
a separate integrated circuit mounted to the memory device, the integrated circuit comprising
application logic configured to generate memory communications signals including a memory address,
communications protocol logic configured to receive memory communications signals in a predetermined format from the application logic and generate memory request signals including the memory address, and
memory interface logic configured to receive the memory request signals,
generate one or more pre-decoded address signals representative of a memory address, and
access a memory array within the memory device using the one or more pre-decoded address signals; and
a plurality of connections configured to communicate the one or more pre-decoded address signals between the integrated circuit and the memory device.

10. The system of claim 9, wherein the format of the memory communications signals is based on
a Joint Electron Device Engineering Council Standard No. 21-C for a memory device,
a Rambus XDR or a RAMBUS XDR2 interface for a memory device a Rambus XMC interface for a memory device,
an Inapac-Qualcomm multi-bank asynchronous interface for a memory device,
a JEDEC DDR2, JEDEC Fast Page mode interface for a memory device,
a JEDEC static column mode interface for a memory device,
a JEDEC EDO (extended data out) mode interface for a memory device,
a JEDEC GDDR3 interface interface for a memory device,
an asynchronous multiplexed addressing with RAS/CAS interface for a memory device,
an asynchronous SRAM-like interface that includes non-multiplex addressing with chip select and Read/Write signaling for a memory device, or
a flash interface for a memory device.

11. A method comprising:
receiving one or more memory communications signals in a predetermined protocol;
decoding the predetermined protocol of the memory communications signals using communications protocol logic to generate memory request signals;
generating one or more decoded memory address signals according to the memory request signals, using memory interface logic disposed on the integrated circuit; and
accessing a memory array within a memory device using the one or more decoded memory address signals.

12. The method of claim 11, wherein the one or more decoded memory address signals are fully decoded memory address signals.

13. The method of claim 11, wherein the one or more decoded memory address signals include a row address strobe signal or a column address strobe signal.

14. The method of claim 11, wherein the integrated circuit is manufactured on a first wafer and the memory device is manufactured on a second wafer.

15. The method of claim 11, further comprising testing the memory device for one or more defects, and storing results of the testing in a memory map disposed on the integrated circuit.

16. The method of claim 11, wherein the step of accessing the memory device is performed asynchronously.

17. An integrated circuit comprising:
an application logic configured to generate a memory access request including a memory address; and
a memory interface logic configured to receive the memory address from the application logic,
decode the memory address to generate one or more decoded memory address signals representative of the memory address,
access a memory device using the one or more decoded memory address signals, and
communicate the one or more decoded memory address signals to a memory device using a bus configured to connect the memory device to the integrated circuit.

18. The integrated circuit of claim 17, wherein the one or more decoded memory address signals are pre-decoded address signals or fully decoded address signals.

19. The integrated circuit of claim 17, wherein the one or more decoded memory address signals are fully decoded asynchronous row address signals.

20. A memory device comprising:
at least one bank of memory comprising an array of memory cells;
a plurality of non-multiplexed connectors configured to receive a plurality of non-multiplexed, pre-decoded row address signals and a plurality of non-multiplexed, pre-decoded column address signals from an external integrated circuit configured to receive memory request signals from an application logic and generate the pre-decoded row address signals and pre-decoded column address signals; and
an asynchronous device interface logic configured to receive the plurality of pre-decoded row address signals, and the plurality of pre-decoded column address signals from the plurality of non-multiplexed connectors and select a memory cell from the array of memory cells.

21. The memory device of claim 20, further comprising a plurality of data write mask inputs.

22. The memory device of claim 20, further comprising at least thirty two data write mask inputs.

23. The memory device of claim 20, further comprising a plurality of data optimized micro pads for vertical bonding.

24. The memory device of claim 20, wherein the plurality of non-multiplexed connectors comprises at least two hundred and fifty six connectors.

25. The memory device of claim 20, wherein the array of memory cells comprises a foundry specific memory array.

* * * * *